United States Patent [19]
Pawlowski et al.

[11] Patent Number: 5,903,916
[45] Date of Patent: May 11, 1999

[54] COMPUTER MEMORY SUBSYSTEM AND METHOD FOR PERFORMING OPPORTUNISTIC WRITE DATA TRANSFERS DURING AN ACCESS LATENCY PERIOD WITHIN A READ OR REFRESH OPERATION

[75] Inventors: Stephen S. Pawlowski, Beaverton; Peter D. MacWilliams, Aloha, both of Oreg.; Sridhar Lakshmanamurthy, Sunnyvale, Calif.

[73] Assignee: Intel Corporation, Santa Clara, Calif.

[21] Appl. No.: 08/766,950

[22] Filed: Dec. 16, 1996

[51] Int. Cl.⁶ .......................... G06F 13/00; G11C 11/407
[52] U.S. Cl. .......................... 711/167; 711/105; 711/106; 711/169; 365/233; 365/189.04; 365/193
[58] Field of Search ............................ 711/5, 104, 105, 711/106, 155, 167, 168, 169; 365/189.04, 193, 230.03, 230.04, 233

[56] References Cited

U.S. PATENT DOCUMENTS

| | | | |
|---|---|---|---|
| 4,823,302 | 4/1989 | Christopher | 711/106 |
| 5,060,145 | 10/1991 | Scheuneman et al. | 711/169 |
| 5,065,365 | 11/1991 | Hirayama | 365/233 |
| 5,301,299 | 4/1994 | Pawlowski et al. | 711/5 |
| 5,623,447 | 4/1997 | Shimoda | 365/233 |
| 5,655,105 | 8/1997 | McLaury | 711/169 |

*Primary Examiner*—Glenn Gossage
*Attorney, Agent, or Firm*—Kenyon & Kenyon

[57] ABSTRACT

A computer memory subsystem and associated method are disclosed in which memory transaction latency and bandwidth in the memory subsystem are improved through the opportunistic transfer of write data from a data path to a memory buffer coupled to a targeted memory bank during an access latency period within a non-memory write operation, such as, e.g., a read or refresh operation. The opportunistic write data transfer operation utilizes otherwise unused memory data bus cycles within a read or refresh operation for performance of the write data transfer, without adding clock cycles to the read or refresh operation. Because the write data is transferred to the memory buffer coupled to the memory bank during the latency period of the memory operation preceding the write operation, the total turnaround time for, e.g., performing a read operation followed by a write operation is reduced.

15 Claims, 6 Drawing Sheets ns:5,903,916

COMPUTER MEMORY SUBSYSTEM AND METHOD FOR PERFORMING OPPORTUNISTIC WRITE DATA TRANSFERS DURING AN ACCESS LATENCY PERIOD WITHIN A READ OR REFRESH OPERATION

FIELD OF THE INVENTION

The present invention relates generally to processor-based computing systems, and more specifically to the transfer of write data to a memory card in a memory subsystem during the access latency period within a read or refresh operation.

BACKGROUND INFORMATION

A read transaction in the memory subsystem of a processor-based computing system consists essentially of the following steps: (1) initiating, via the memory controller, the read operation; (2) generating the row address strobe/ column address strobe (RAS/CAS) memory timing signals, and applying them to the memory bank targeted by the read operation; (3) once the read data is available on the memory bank's memory data bus, buffering the read data into a buffer coupled to the memory bank; and (4) transferring the data from the memory buffer into a data path buffer for storage until the data is placed onto the processor bus for transmission to the processor or device requesting the data. The time period between the initiation of a read operation by the memory controller within the memory subsystem and the time at which the read data is available on the memory data bus constitutes an access latency.

A write operation in a memory subsystem consists essentially of the following steps: (1) transferring the write data from the data path in the memory subsystem to a buffer coupled to the targeted memory bank; (2) initiating, via the memory controller, the write operation; and (3) generating the necessary RAS/CAS memory timing signals, and applying them to the memory bank targeted by the write operation.

In conventional memory subsystems, when a read or refresh operation is followed by a write operation, all of the read or refresh operation steps are performed prior to the initiation of the write operation steps. This results in a large transaction overhead, or "turnaround time." It is desired, therefore, to minimize the turnaround time associated with a read or refresh operation followed by a write operation in a memory subsystem of a processor-based computing system.

SUMMARY OF THE INVENTION

An embodiment of the present invention improves memory transaction latency and bandwidth through the opportunistic transfer, within a memory subsystem, of write data from a data path to a buffer coupled to a targeted memory bank during an access latency period within a non-memory write operation such as, e.g., a read or refresh operation. The present invention takes advantage of the otherwise unused memory data bus cycles within a read or refresh operation to perform the write data transfer, without adding clock cycles to the read or refresh operation. Because the write data is transferred to the memory buffer coupled to the memory bank during the latency period of the memory operation preceding the write operation, the total turnaround time for, e.g., performing a read operation followed by a write operation is reduced as compared with the prior art.

DETAILED DESCRIPTION

Figure 1:
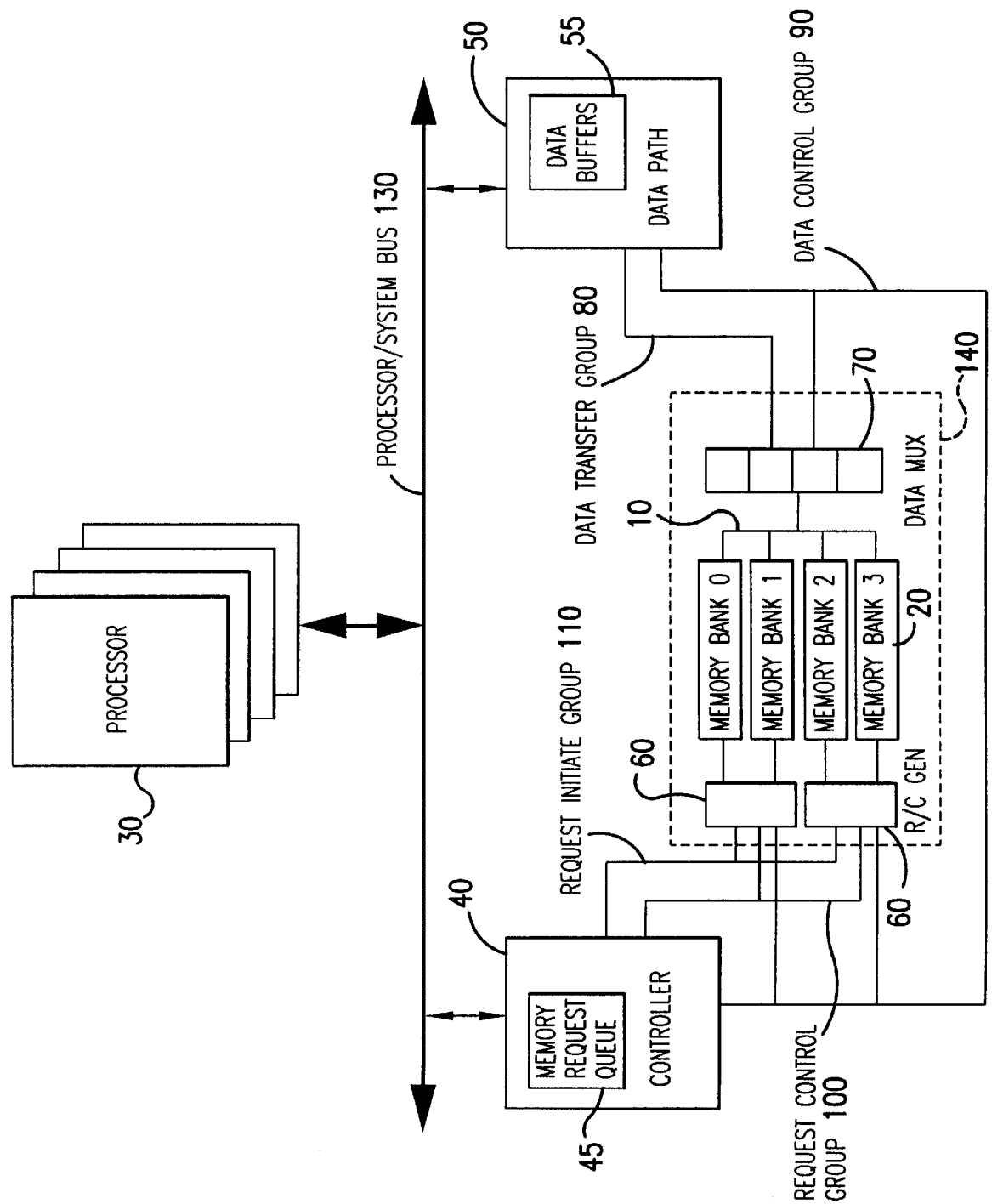
FIG. 1 depicts a block diagram of one embodiment of a processor and memory subsystem for performing an opportunistic write data transfer according to the present invention.

FIG. 1 depicts a block diagram of a memory subsystem for performing an opportunistic write data transfer operation according to one embodiment of the present invention. The particular memory subsystem configuration depicted in FIG. 1 is used for illustrative purposes only. Implementation of the opportunistic write data transfer of the present invention is not limited to the memory subsystem depicted in FIG. 1, but, rather, is possible with a wide variety of memory subsystem configurations.

The memory subsystem illustrated in FIG. 1 is comprised of a controller 40, a data path 50, two row address strobe/ column address strobe (RAS/CAS) generators 60, and a data multiplexer/buffer 70. Within the controller 40 is a memory request queue 45. Within the data path 50 are one or more data buffers 55. The controller 40 and data path 50 of the illustrated memory subsystem are coupled to the computer system's processor/system bus 130, which is, in turn, coupled to the computing system's processor(s) 30.

Data and control information within the illustrated memory subsystem are communicated via various communication signal groups. The request initiate group 110 is used to communicate memory transaction commands and the associated addresses of targeted memory locations. The request control group 100 communicates handshaking signals related to performance of memory transactions. The data transfer group 80 carries data between the data path 50 and the memory card 140. The data control group 90 communicates handshaking signals related to the transfer of data between the data path 50 and the memory card 140.

Figure 2:
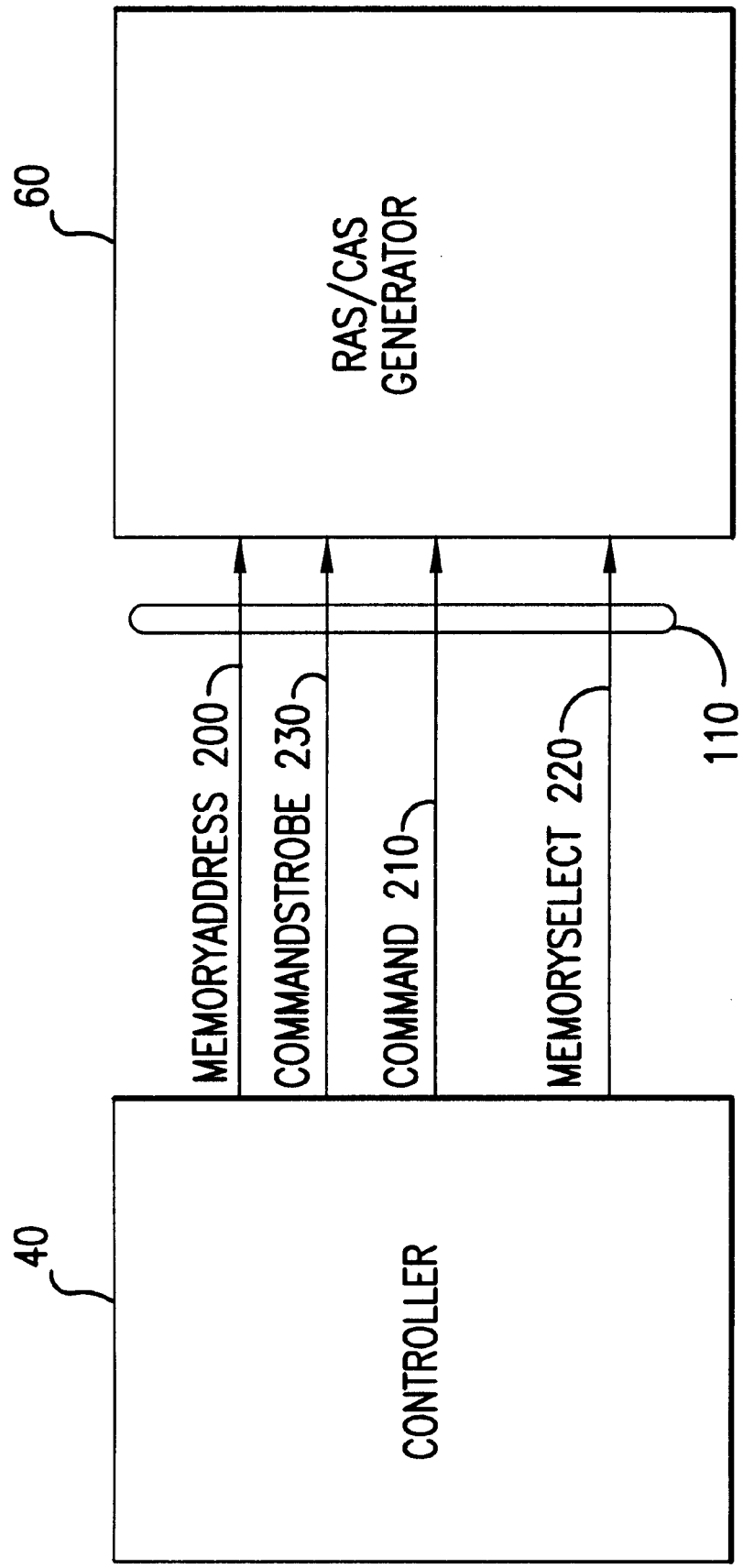
FIG. 2 depicts the signals communicated between a controller and RAS/CAS generators via the request initiate group according to the embodiment of the memory subsystem depicted in FIG. 1.

FIG. 2 depicts the signals communicated between the controller 40 and the RAS/CAS generators 60 via the request initiate group 110 according to the embodiment of the memory subsystem illustrated in FIG. 1. Table 1 provides a summary of the request initiate group 110 signals:

TABLE 1

| Signal | Source | Destination | Definition |
| --- | --- | --- | --- |
| MemoryAddress [13:0] | controller | RAS/CAS generator | Memory address bus signals. These signals define the address of the location to be accessed in the memory. During the first cycle of CommandStrobe active, the RAS addresses are valid. During the clock after CommandStrobe active, the CAS addresses are valid. |
| CommandStrobe | controller | RAS/CAS generator | When active, this strobe indicates thg initiation of a memory access. |
| Command [1:0] | controller | RAS/CAS generator | These signals, validated with CommandStrobe, encode the command of the current memory operation. A value of 00 in the first cycle indicates a read operation; a value of 01 in the first cycle indicates a write operation; a value of 10 indicates a refresh operation. |
| MemorySelect [5:0] | controller | RAS/CAS generator | These signals, validated with CommandStrobe, indicate the memory board, bank and row targeted by the memory operation. |

Figure 3:
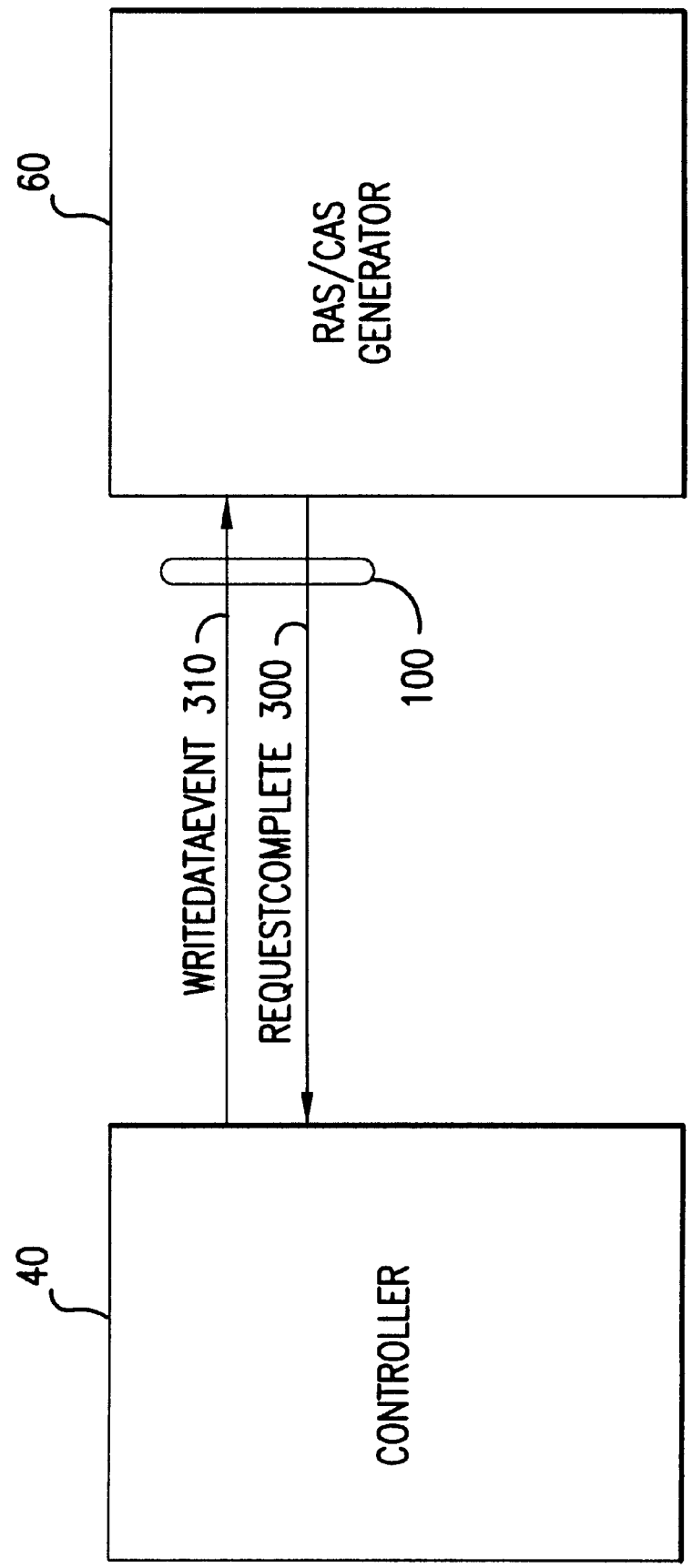
FIG. 3 depicts the handshaking information communicated between the controller and the RAS/CAS generators via the request control group according to the embodiment of the memory subsystem depicted in FIG. 1.

FIG. 3 depicts the handshaking signals communicated between the controller 40 and the RAS/CAS generators 60 via the request control group 100 according to the embodiment of the memory subsystem illustrated in FIG. 1. Table 2 provides a summary of the request control group 100 signals:

TABLE 2

| Signal | Source | Destination | Definition |
| --- | --- | --- | --- |
| RequestComplete | RAS/CAS generator | controller | This signal, which is driven by the device selected by MemorySelect, indicates the completion of a request into the memory array. |
| WriteDataEvent | controller | RAS/CAS generator | This signal is used to identify the window for write data transfers between the data path and the MUX/buffer. The signal informs the RAS/CAS generators that a particular data transfer corresponds to a write transaction. |

Figure 4:
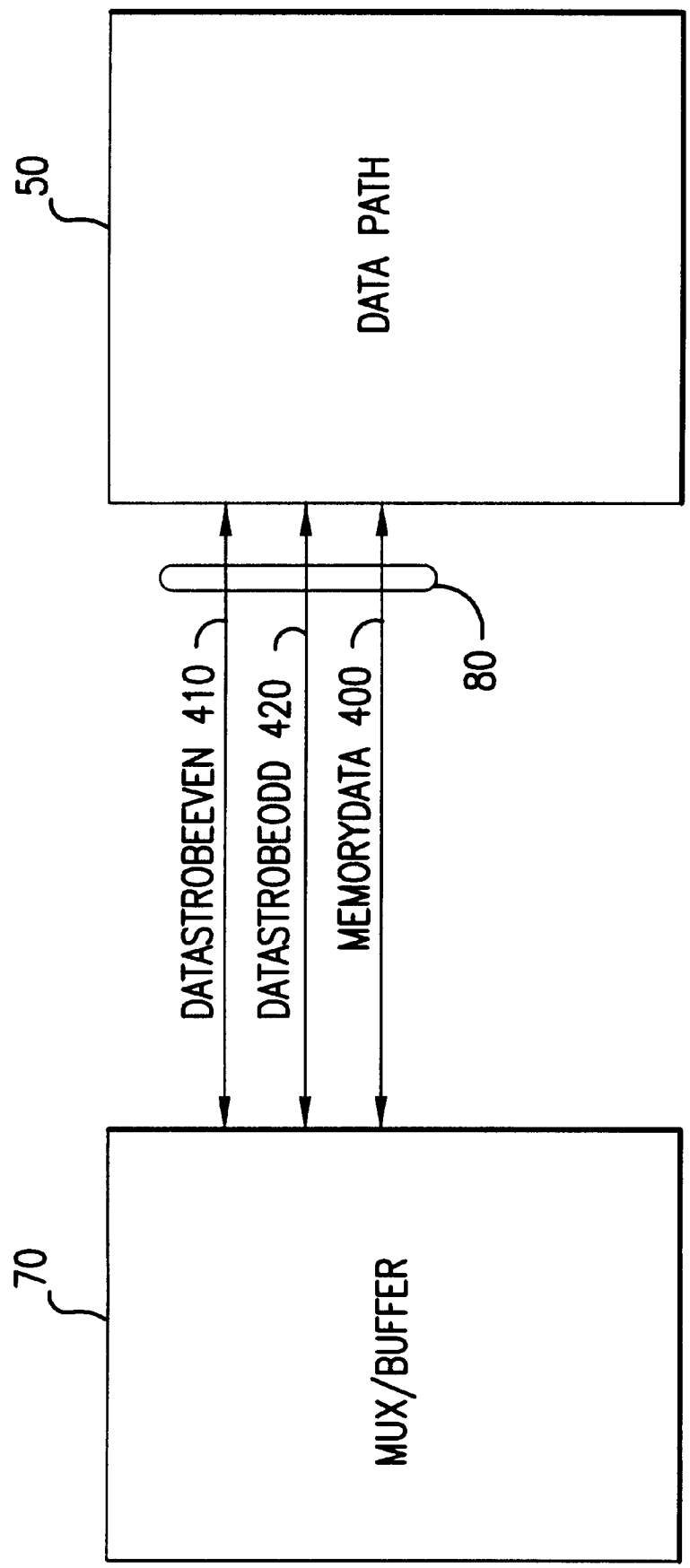
FIG. 4 depicts the data information communicated between the multiplexers and the data path via the data transfer group according to the embodiment of the memory subsystem depicted in FIG. 1.

FIG. 4 depicts the data and control information communicated between the multiplexer/buffer 70 and the data path 50 via the data transfer group 80 according to the embodiment of the memory subsystem illustrated in FIG. 1. Table 3 provides a summary of the data transfer group 80 signals:

TABLE 3

| Signal | Source | Destination | Definition |
| --- | --- | --- | --- |
| MemoryData [72:0] | MUX/buffer, data path | MUX/buffer, data path | These are the data transfer signals. |
| DataStrobeOdd [3:0] | MUX/buffer, data path | MUX/buffer, data path | These signals qualify the validity of the first and third QWORDS of a data transfer. (Where a QWORD is an, e.g., 64-bit data element). |
| DataStrobeEven [3:0] | MUX/buffer, data path | MUX/buffer, data path | These signals qualify the validity of the second and fourth QWORDS of a data transfer. |

Figure 5:
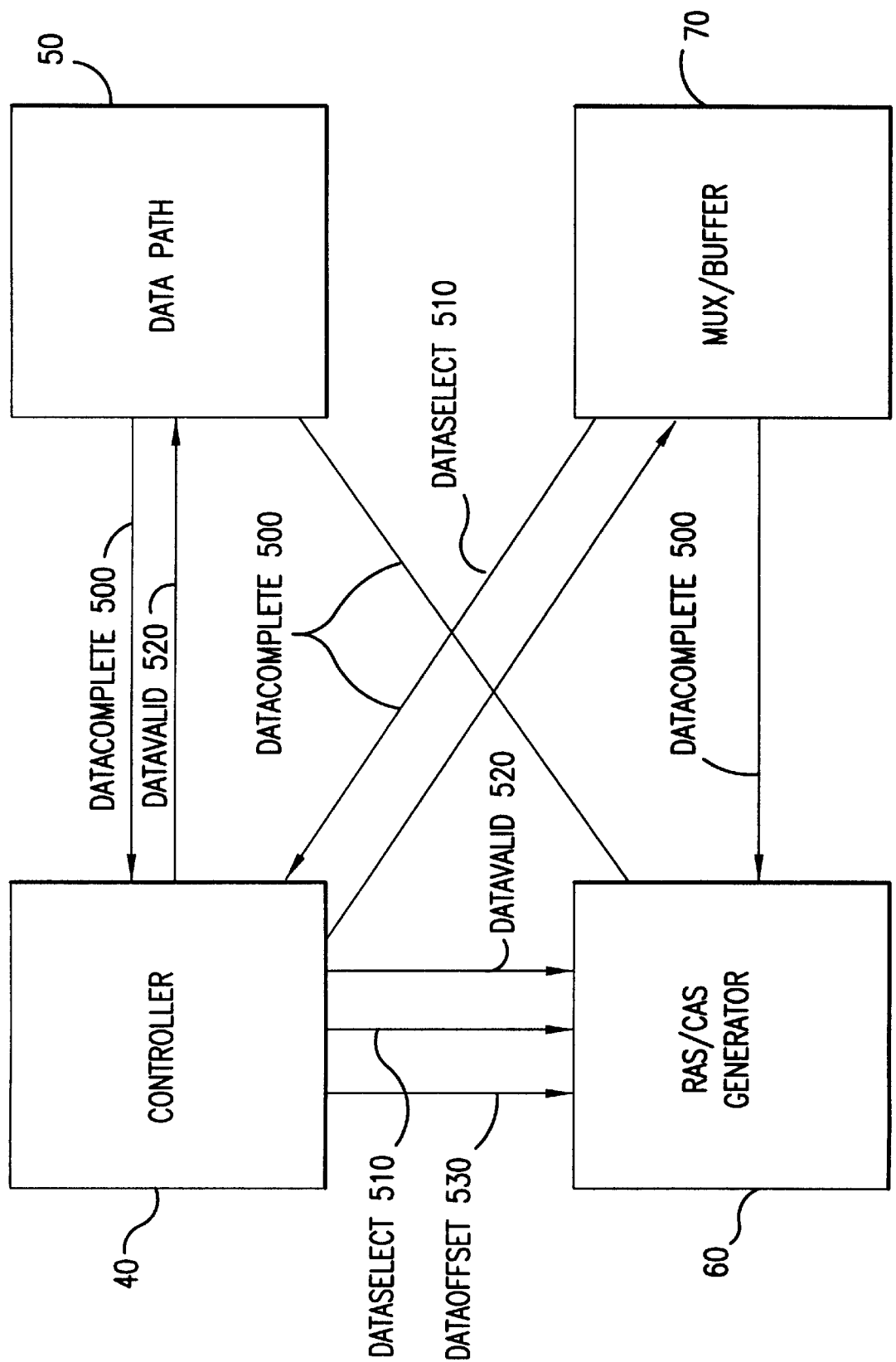
FIG. 5 depicts the handshaking information communicated via the data control group according to the embodiment of the memory subsystem depicted in FIG. 1.

FIG. 5 depicts the handshaking information communicated via the data control group 90 according to the embodiment of the memory subsystem illustrated in FIG. 1. Table 4 provides a summary of the data control group 90 signals:

TABLE 4

| Signal | Source | Destination | Definition |
|---|---|---|---|
| DataSelect [1:0] | controller | RAS/CAS generator, data path | These signals indicate the memory card which is the source or destination for the next data transfer. |
| DataOffset [1:0] | controller | RAS/CAS generator | These two bits define the initial QWORD access order for the data transfer. |
| DataValid | controller | RAS/CAS generator, data path | This signal, when active, indicates that the DataSelect signal is valid. It is activated, at the minimum, in the second clock after DataSelect is active. It is repeated, at most, every two clocks. |
| DataComplete | MUX/buffer, data path | controller, RAS/CAS generator | This signal is driven by the source of the data transfer during valid DataSelect activation. When active, it indicates that the data transfer is complete. This signal is activated one clock before the last data transfer clock on the data transfer group. |

Referring to FIGS. 1–5, memory transaction requests are communicated to the memory subsystem over the processor/system bus 130. Memory requests are received from the processor/system bus 130 by the controller 40, and stored in the controller's memory request queue 45. From these stored memory requests, the controller 40 generates (as shown in FIG. 2) Command 210, MemoryAddress 200, MemorySelect 220 and CommandStrobe 230 signals, which it communicates to the RAS/CAS generators 60 via the request initiate group 110 communication lines.

The controller 40 need not wait for a particular memory request to be completed before it issues further memory requests to the RAS/CAS generators 60. While multiple memory requests, initiated by the controller 40, may be outstanding at a given time, the data transfers related to these memory requests occur in the same time order as the issued requests. Note, however, that the generation of memory requests to the RAS/CAS generators 60 by the controller 40 does not necessarily occur in the same time order as the memory requests were received by the controller 40 from the processor/system bus 130. That is, the memory request queue 45 is not necessarily a first-in first-out (FIFO) queue.

In order to reduce transaction overhead time, the RAS/CAS generators 60 are each capable of buffering two controller-issued memory requests per associated memory bank 20. The RAS/CAS generators 60, upon reception of memory requests from the controller 40, generate the appropriate RAS/CAS memory timing signals and apply them to the memory banks 20. The multiplexer/buffer 70 includes data buffers for the simultaneous buffering of data coming from and going to the memory banks 20 via the memory data bus 10. In the illustrated memory subsystem, each multiplexer/buffer 70 includes separate, 2-deep buffers for incoming data (i.e., data to be written to the memory banks 20) and outgoing data (i.e., data read from the memory banks 20). The amount of multiplexing needed depends upon the amount of memory interleaving in the memory subsystem, as well as upon the data width of the data transfer group 80 communication lines.

In one embodiment of the memory subsystem depicted in FIG. 1, the processor/system bus 130 has a 64-bit data width, read and write operations are done on a 256-bit cache line basis, and the memory banks 20 have 4:1 interleaving. The memory data bus 10 has a 256-bit data width, and the multiplexer/buffer 70 includes four 64-bit to 16-bit multiplexing elements. Thus, in this particular embodiment, each access to the memory banks 20 is on a cache line basis (i.e., 256 bits), and the multiplexer/buffer 70 multiplexes the 256 bits down to 64 bits for outgoing data (i.e., read data) and demultiplexes 64 bits to 256 bits for incoming (i.e., write) data.

A read transaction according to the illustrated memory subsystem is performed as follows. The controller 40 receives the memory read transaction over the processor/system bus 130 and places it in the memory request queue 45. Once the read transaction reaches the top of the queue 45, via whatever queue processing algorithm is employed, the controller 40 generates a Command signal 210, indicating a read operation, a MemoryAddress signal 200, with the address of the main memory location targeted by the read, a MemorySelect signal 220, indicating the memory card 140, memory bank 20, and memory row within the bank 20 targeted by the read, and a CommandStrobe signal 230, indicating that the memory operation can commence. The Command 210, MemoryAddress 200, MemorySelect 220, and CommandStrobe 230 signals are communicated to the RAS/CAS generators 60 via the request initiate group 110 lines.

The RAS/CAS generator 60 coupled to the targeted memory bank 20 places the Command 210, MemoryAddress 200 and MemorySelect 220 information in its inbound transaction buffer, generates the appropriate RAS/CAS memory timing signals and applies them to the targeted memory bank 20. The RAS/CAS generator 60 then sends a RequestComplete signal 300 (FIG. 3) to the controller 40, over the request control group 100 lines, signaling guaranteed completion of the memory operation by the RAS/CAS generator 60.

The controller 40 and the RAS/CAS generators 60 in the memory subsystem each maintain a FIFO queue containing all outstanding memory transactions issued by the controller 40 over the request initiate group 110 lines. Each RAS/CAS generator 60 waits until the memory operation it has just completed reaches the top of the FIFO before it sends a RequestComplete signal 300 to the controller 40. Thus, reception of a RequestComplete signal 300 informs the controller 40 of completion of the oldest outstanding memory transaction, and RequestComplete signals 300 occur in the same time order as their corresponding memory Command signals 210.

After issuing the Command signal 210 for the read operation to the RAS/CAS generator 60, the controller 40, via a private bus (not shown in FIG. 1), sends an inbound data buffer write command to the data path 50, informing the data path 50 of the forthcoming read data, and instructing the data path 50 as to which data buffer 55 to place the incoming read data into. In the illustrated memory subsystem, the controller 40 maintains information regarding which data buffers 55 on the data path 50 contain what data and which are available to take in new data.

In response to the RAS/CAS timing signals, the memory bank 20 outputs the targeted read data to the multiplexer/buffer 70 (via the memory data bus 10), where the data is multiplexed, if necessary, and buffered.

After receiving the RequestComplete 300 signal corresponding to the read transaction from the RAS/CAS generator 60, the controller 40 activates DataSelect 510, DataValid 520, and DataOffset 530 signals (FIG. 5), which are used to indicate that a data transfer can commence. The DataSelect 510 and DataOffset 530 signals indicate to the data path 50 and to the RAS/CAS generators 60 which memory card 140 is the source of the read data (for use in memory subsystems employing multiple memory cards 140), as well as which order the QWORDS within the data to be transferred are accessed. The DataValid signal 520 indicates that the data transfer can commence.

In response to the DataSelect 510/DataOffset 530/DataValid 520 signals, the appropriate RAS/CAS generator 60 triggers the transmission of the read data, as a MemoryData signal 400, from the multiplexer/buffer 70, over the data transfer group 80 lines, to the data path 50. Once the data transfer is complete, the multiplexer/buffer 70 initiates a DataComplete signal 500 (FIG. 5), which informs the controller 40 and RAS/CAS generator 60 of the completion of the data transfer to the data path 50, so that the controller 40 can initiate data transfers for other memory transactions. Similar to the relationship between the Command 210 and RequestComplete 300 signals, DataComplete 500 signals are issued in the same time order as their corresponding DataValid 520/DataSelect510/Data Offset 530 data transfer signals.

Once the read data is in a data buffer 55 on the data path 50, the controller 40 requests ownership of the processor/system bus 130 and, via a private communication bus (not shown in FIG. 1), directs transfer of the read data by the data path 50 from the data buffer 55 onto the processor/system bus 130 for delivery to the entity requesting the data.

A memory write transaction according to the embodiment of the illustrated memory subsystem is performed as follows. When a write transaction is issued to the controller 40 over the processor/system bus 130, the controller 40, via a private bus (not shown), directs the data path 50 to take the write data from the processor/system bus 130 and place it in a particular one of the data buffers 55. When the controller 40 is ready for the write data to be transferred from the data path 50 to the multiplexer/buffer 70, the controller 40 issues DataSelect 510/DataOffset 530/DataValid 520 signals, which instruct the data path 50 to place the data on the data transfer group 80 and instruct the multiplexer/buffer 70 to load in, demultiplex, and buffer the data from the data transfer group 80.

Once the write data is loaded into the multiplexer/buffer 70, the controller 40 issues a write command (i.e., issues the appropriate Command 210, MemoryAddress 200, MemorySelect 220 and CommandStrobe 230 signals) over the request initiate group 110 to instruct the RAS/CAS generator 60 coupled to the memory bank 20 targeted by the write data to issue the necessary RAS/CAS signals to enable the data from the multiplexer/buffer 70 to be written to the memory bank 20. Once these RAS/CAS signals are issued, the RAS/CAS generator 60 generates a RequestComplete 300 signal to the controller 40 over the request control group 100. Write commands from the controller 40 to the RAS/CAS generators 60 are issued in the same order that write data packets are transferred from the data path 50 to the data multiplexer/buffers 70.

A memory read transaction consists of a read operation (i.e., generation and application of the commands and RAS/CAS timing signals necessary to elicit the read data from the appropriate memory bank 20) followed by a data transfer operation (i.e., transfer of the read data from the appropriate multiplexer/buffers=70 to the data path 50). In contrast, a memory write transaction consists of a data transfer operation (i.e., transfer of write data from the data path 50 to the appropriate multiplexer/buffer 70) followed by a write operation (i.e., generation and application of the commands and RAS/CAS timing signals necessary to load the write data from the multiplexer/buffer 70 into the memory bank 20).

Because the data transfer operation of a write transaction occurs prior to the write operation (and thus prior to the Command 210/MemorySelect 220/MemoryAddress signals 200 (FIG. 2) informing the RAS/CAS generators of the write transaction), a WriteDataEvent signal 310 (FIG. 3) is used by the controller 40, in conjunction with the DataSelect 510/DataValid 520/Data Offset signals 530 (FIG. 5), to inform the RAS/CAS generators 60 that a particular data transfer from the data path 50 to the data multiplexer/buffer 70 corresponds to a write transaction. The WriteDataEvent 310 signal allows the DataSelect 510/DataValid 520/DataOffset 530 signals to be used for both read and write data transfer operations. When WriteDataEvent 310 is inactive, the data transfer signals (i.e., DataSelect 510/DataValid 520/DataOffset 530) indicate that a particular data transfer is associated with a read transaction, and when WriteDataEvent 310 is active, the data transfer signals indicate that the data transfer is associated with a write transaction.

Figure 6:
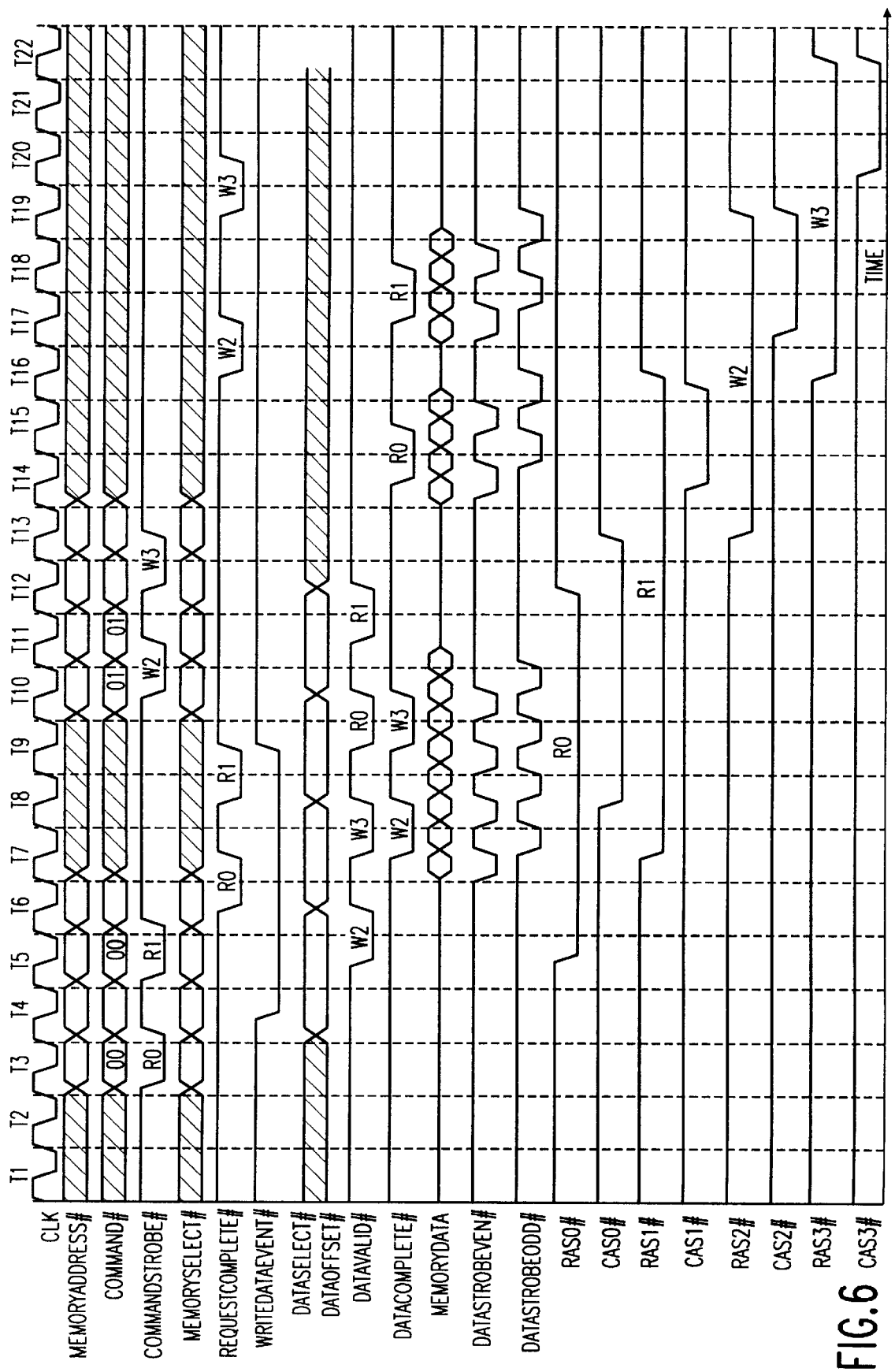
FIG. 6 is a timing diagram which illustrates performance of a write within read operation as implemented by the embodiment of the memory subsystem depicted in FIG. 1.

FIG. 6 is a timing diagram which illustrates an opportunistic write data transfer operation according to one embodiment of the present invention, as implemented in the memory subsystem depicted in FIG. 1. The timing diagram illustrates the transfer of data for a write operation from the data path 50 to the data multiplexer/buffer 70 on the memory card 140 during the latency period of an R0 read operation.

The timing diagram of FIG. 6 shows two read operations, R0 and R1, followed by two write operations, W2 and W3. The first read operation, R0, is issued by the controller 40 (through the use of the Command 210, MemoryAddress 200, MemorySelect 220, and CommandStrobe 230 signals)

to the appropriate RAS/CAS generator 60 during clock T3. The second read operation, R1, is issued by the controller 40 to the appropriate RAS/CAS generator 60 during clock T5.

While the RAS/CAS generators 60 are generating the appropriate RAS/CAS memory timing signals for the read operations and applying them to the targeted memory banks 20, the controller 40 initiates the transfer of data for the write operation W2 from the data path 50 to the data multiplexer/buffer 70. This is done through the use of the DataSelect 510, DataOffset 530 and DataValid 520 signals, and an active WriteDataEvent signal 310 in T4, to make the RAS/CAS generators 60 aware of the impending transfer of write data from the data path 50 to the data multiplexer/buffer 70.

Although the RequestComplete signal 300 corresponding to R0 is active on the request control group 100 lines in T6–7, it is not observed within the controller 40 until, e.g., T7–8. Thus, the controller 40 initiates a second write data transfer, corresponding to W3, in T7, because the RequestComplete signal 300 corresponding to R0 had not yet been seen by the controller 40 at that time.

Following initiation of the second write data transfer (i.e., the transfer for W3), and after the controller 40 observes the RequestComplete signal 300 corresponding to R0, the controller 40 releases the WriteDataEvent signal 310 and issues (beginning in T8) the necessary DataSelect 510/DataOffset 530/DataValid 520 signal for the transfer of the R0 read data from the multiplexer/buffer 70 to the data path 50. By releasing the WriteDataEvent signal 310 once a RequestComplete signal 300 for a read is observed, the controller 40 ensures that the opportunistic write data transfer operation(s) do not add latency to the read transaction execution.

Following issuance of the data transfer signals for R0, the controller 40 issues (beginning in T10) the signals necessary for the R1 read data transfer from the multiplexer/buffer 70 to the data path 50.

The memory commands for each of the write operations, W2 and W3, can be issued to the RAS/CAS generators 60 once the write data has been transferred to the multiplexer/buffer 60 and the DataComplete signal 500 corresponding to the transfer has been issued. In the timing diagram of FIG. 6, the command 210, MemoryAddress 200, MemorySelect 220 and CommandStrobe 230 signals for W2 are issued beginning in T10, while the memory write operation signals for W3 are issued in T12. The RequestComplete signals 300 corresponding to the W2 and W3 memory transactions are generated by the appropriate RAS/CAS generators 60 in T16 and T19, respectively, Although one embodiment is specifically illustrated and described herein, it will be appreciated that modifications and variations of the present invention are covered by the above teachings and within the purview of the appended claims without departing from the spirit and intended scope of the invention. Such variations might include, for example, changes in the series of memory transactions in which an opportunistic write data transfer according to the present invention can be employed. While the timing diagram of FIG. 6 depicts two read data operations followed by two write data operations, this is for illustrative purposes only. The opportunistic write data transfer of the present invention can be employed when, for example, a single read operation is followed by a single write operation. In addition, the present invention can be utilized in conjunction with other non-memory write operations, such as, e.g., a memory refresh operation (i.e., when a refresh operation is followed by a write operation), with the transfer of write data from the data path 50 to the multiplexer/buffer 70 occurring while the RAS/CAS signals for the refresh operation are being generated and applied to a memory bank.

Similarly, as noted above, the memory subsystem depicted in FIG. 1, and the corresponding communication signals illustrated in FIGS. 2–6, are used in this disclosure for illustrative purposes only, as a wide variety of memory subsystem configurations can be employed in practicing the present invention. For example, the invention could be implemented in a memory subsystem having a controller 40 which incorporates the functionality of the RAS/CAS generators 60 and/or the data path 50 depicted in FIG. 1. In addition, a simple buffer, rather than a multiplexer/buffer 70 could be used, as multiplexing of the data from the memory data bus 10 may not be required in all memory subsystems employing the present invention.

What is claimed is:

1. A method for performing an opportunistic write data transfer in a memory subsystem having a controller, a memory bank coupled to the controller, a first data buffer coupled to the memory bank, and a data path coupled to the first data buffer and to the controller, the data path including a second data buffer storing write data, the method comprising the steps of:
    (A) initiating, via the controller, a non-memory write operation wherein said non-memory write operation comprises generating and applying first row address strobe (RAS) and column address strobe (CAS) timing signals;
    (B) while generating and applying the first RAS and CAS timing signals, activating a write transfer signal to indicate that a write data transfer operation is occurring and transferring the write data from the data path to the first data buffer;
    (C) receiving a complete signal when the generating and applying of the first RAS and CAS timing signals is complete; and
    (D) releasing said write transfer signal when said complete signal is received to indicate that said write data transfer operation is not occurring.

2. The method according to claim 1, wherein the transferring step includes transferring a first set of write data and a second set of write data from the data path to the first data buffer.

3. The method of claim 1, further comprising the step of:
    (E) ending said write data transfer operation when said complete signal is received; and
    (F) transferring read data from said first data buffer to the data path.

4. The method of claim 1, further comprising the step of:
    (E) ending said write data transfer operation when said complete signal is received; and
    (F) transferring read data from said data buffer to the data path.

5. The method according to claim 1, wherein the non-memory write operation is a read operation.

6. The method according to claim 5, wherein the memory subsystem further includes a row address strobe (RAS) and column address strobe (CAS) generator coupled between the controller and the memory bank, and wherein the initiation step includes issuing a read command from the controller to the RAS and CAS generator.

7. The method according to claim 5 wherein the read operation includes receiving read data from the memory bank in response to the first RAS and CAS timing signals, and placing the read data in the first data buffer, said method further comprising the step of:

(C) following the transfer of the write data, initiating a transfer of the read data from the first data buffer to the data path.

8. The method according to claim 7, further comprising the step of:

(D) following the initiation of the transfer of the read data from the first data buffer to the data path, initiating a memory write operation.

9. The method according to claim 8 wherein the memory write operation includes generating second RAS and CAS memory timing signals, applying the second RAS and CAS timing signals to the memory bank, and loading the write data into the memory bank in response to the second RAS and CAS timing signals.

10. A method for performing an opportunistic write data transfer in a memory subsystem having a controller, a memory bank coupled to the controller, a data buffer coupled to the memory bank, and a data path coupled to the data buffer, the method comprising the steps of:

(A) initiating a memory refresh operation, wherein the memory refresh operation comprises generating and applying row address strobe (RAS) and column address strobe (CAS) timing signals;

(B) while generating and applying the RAS and CAS timing signals, activating a write transfer signal to indicate that a write data transfer operation is occurring and transferring write data from the data path to the data buffer;

(C) receiving a complete signal when the generating and applying of the RAS and CAS timing signals is complete; and (D) releasing said write transfer signal when said complete signal is received to indicate that said write data transfer operation has ended.

11. A method for performing an opportunistic write data transfer in a memory subsystem having a controller, a memory bank coupled to the controller, a data buffer coupled to the memory bank, and a data path coupled to the data buffer, the method comprising the steps of:

(A) initiating a memory read operation, wherein the memory read operation comprises generating and applying row address strobe (RAS) and column address strobe (CAS) timing signals;

(B) while generating and applying the RAS and CAS timing signals, activating a write transfer signal to indicate that a write data transfer operation is occurring and transferring write data from the data path to the data buffer;

(C) receiving a complete signal when the generating and applying of the RAS and CAS timing signals is complete; and (D) releasing said write transfer signal when said complete signal is received to indicate that said write data transfer operation has ended.

12. A memory subsystem comprising:

(A) a memory bank;

(B) a buffer coupled to the memory bank;

(C) a data path, coupled to the buffer; and (D) a controller, coupled to the memory bank and to the data path, for initiating a memory read operation that comprises generating and applying row address strobe (RAS) and column address strobe (CAS) timing signals, while generating and applying the RAS and CAS timing signals, activating a write transfer signal to indicate that a write data transfer operation is occurring and initiating a transfer of write data from the data path to the buffer, receiving a complete signal when the generating and applying of the RAS and CAS timing signals is complete, and releasing said write transfer signal when said complete signal is received to indicate that said write data transfer operation has ended.

13. The memory subsystem according to claim 12, wherein the controller and the data path are included in a single device.

14. A memory subsystem comprising:

(A) a memory bank;

(B) a buffer coupled to the memory bank;

(C) a data path, coupled to the buffer; and (D) a controller, coupled to the memory bank and to the data path, programmed to initiate a memory refresh operation that comprises generating and applying row address strobe (RAS) and column address strobe (CAS) timing signals, while generating and applying the RAS and CAS timing signals, activate a write transfer signal to indicate that a write data transfer operation is occurring and initiate a transfer of write data from the data path to the buffer, receive a complete signal when the generating and applying of the RAS and CAS timing signals is complete, and release said write transfer signal when said complete signal is received to indicate that said write data transfer operation has ended.

15. A computing system, comprising:

(1) a processor;

(2) a processor/system bus coupled to the processor; and (3) a memory subsystem, coupled to the processor/system bus, comprising:

(A) a memory bank;

(B) a buffer coupled to the memory bank;

(C) a data path, coupled to the buffer; and (D) a controller, coupled to the memory bank and to the data path, programmed to initiate a memory read operation that comprises generating and applying row address strobe (RAS) and column address strobe (CAS) timing signals, while generating and applying the RAS and CAS timing signals, activate a write transfer signal to indicate that a write data transfer operation is occurring and initiate a transfer of write data from the data path to the buffer, receive a complete signal when the generating and applying of the RAS and CAS timing signals is complete, and release said write transfer signal when said complete signal is received to indicate that said write data transfer operation has ended.

* * * * *